United States Patent [19]

Brounley

[11] Patent Number: 5,473,291
[45] Date of Patent: Dec. 5, 1995

[54] SOLID STATE PLASMA CHAMBER TUNER

[75] Inventor: Richard W. Brounley, Largo, Fla.

[73] Assignee: Brounley Associates, Inc., Largo, Fla.

[21] Appl. No.: 429,898

[22] Filed: Apr. 27, 1995

Related U.S. Application Data

[63] Continuation-in-part of Ser. No. 340,655, Nov. 16, 1994, abandoned.

[51] Int. Cl.$^6$ .................................................. H03H 7/40
[52] U.S. Cl. ............................ 333/17.3; 334/55; 334/56
[58] Field of Search ................... 333/17.3, 32; 334/56, 334/71, 55

[56] References Cited

U.S. PATENT DOCUMENTS

| | | | |
|---|---|---|---|
| 3,906,405 | 9/1975 | Kommrusch | 333/17.3 |
| 4,486,722 | 12/1984 | Landt | 333/17.3 |
| 4,502,028 | 2/1985 | Carl, Jr. et al. | 333/17.3 X |
| 4,621,242 | 11/1986 | Theall, Jr. et al. | 333/17.3 |
| 4,701,732 | 10/1987 | Nestlerode | 333/32 X |

*Primary Examiner*—Paul Gensler
*Attorney, Agent, or Firm*—James E. Larson; Herbert W. Larson

[57] ABSTRACT

A solid state automatic tuner is used in a plasma processing system for measuring and adjusting a voltage standing wave ratio of the system. The tuner has a switched variable inductor circuit controlled by an automatic control system coupled to an impedance matching circuit. The impedance matching circuit provides an intermediate impedance and matches an output impedance of an RF generator to the varying impedance of a plasma chamber. A variable inductor of the switched variable inductor is constructed as a transformer and allows different values of inductance to be switched in and out of a secondary winding of the transformer. FET switches control pin diodes permitting the different values of inductance to be switched in and out in steps. A VSWR comparator of the control system continuously compares a desired VSWR set point for the system to the current VSWR of the system. A sequence scanner controls the FET switches.

20 Claims, 4 Drawing Sheets

SOLID STATE PLASMA CHAMBER TUNER

PRIOR APPLICATIONS

This is a continuation-in-part of application Ser. No. 08/340,655, filed Nov. 16, 1994, now abandoned.

BACKGROUND OF THE INVENTION

1. Field of the Invention

This invention relates to plasma chamber tuners. More particularly, it relates to a solid state tuner used to measure and match voltage standing wave ratios between an RF generator and a plasma chamber.

2. Description of Prior Art

Plasma chambers are low pressure, gas filled enclosures used in processing operations such as RF sputtering, plasma etching/depositions, and reactive ion etching. These processing operations are used primarily for integrated circuit fabrication. The plasma chambers are excited by RF generators running generally in the ISM frequency bands of 13.56 MHz, 27.12 MHz, and 40.68 MHz. Although lower and higher frequencies can be employed with plasma processing systems, 13.56 MHz is the predominate frequency used in the RF generator market. Typical power levels for the RF generators are in the range of 250 to 2500 watts and usually designed employing transistors operating in saturated class AB or D.

The design of the RF generators make them sensitive to voltage standing wave ratios (VSWR) of the load in a plasma processing system. Regulation of the forward power and thermal derating is necessary as well as protection over a wide changing impedance range. Further, since the process being performed by the plasma chamber is sensitive to the power delivered, wherein fluctuations can result in poor processing quality by the chamber, control of any fluctuation in power due to the interaction between the RF generator and plasma chamber is required.

Many of the regulation, protection, and control requirements, due to the interaction between RF generators and plasma chambers in a plasma processing system, have been addressed by inserting an automatic tuner between the generator and chamber. This has been done in the prior art by utilizing electro-mechanical tuners. Mostly, the prior art tuners are motor driven devices employing variable capacitors for adapting the output impedance of the generator to the input impedance of the chamber.

Although many of the electo-mechanical tuners of the prior art have been successful in matching a wide range of VSWR's, they possess many inherent deficiencies. Examples of these deficiencies include: slow response time—typically one to two seconds; poor reliability—mean time between failure (MTBF) figures are the lowest of any component used in the processing system; loss—the tuner can have a significant power loss during its generator to chamber impedance matching; varying loss—causes power to the chamber to fluctuate resulting in poor processing within the chamber and requiring a higher powered RF generator; additional cooling requirements are usually needed for both the RF generator and tuner because of the loss; expense—electro-mechanical tuners can cost as much as the RF generator, a cost most likely passed on to the consumer by the operator or owner of the processing system.

There exists a need for an improvement to tuners used in plasma processing systems to eliminate the inherent deficiencies encountered with tuners of the prior art.

SUMMARY OF THE INVENTION

I have invented an automatic tuner for use with plasma processing systems which has effectively eliminated the inherent deficiencies of the prior art tuners. My tuner is a solid state device employing a two step design low loss matching circuit which resonates the chamber capacitance with a variable inductor. The variable inductor constructed as a transformer has different values of inductance switched in and out of the secondary of the transformer, thereby varying the effective value of the variable inductor. The switching is implemented in steps using pin diodes. The pin diodes are forward biased by FET (Field Effect Transistor) switches, the FET switches utilizing a single switched voltage input coupled to the gate contact of the FET switch. The FET drivers are unique to pin diode switching which negate the necessity for a second high voltage source for reverse biasing the pin diodes. The high off resistance of the FET switches causes very low rectified current in the circuit which provides self reverse biasing to the pin diodes.

Automatic selection of the required inductance encountered during a processing operation is accomplished by a tuner control system having a comparator and a sequence scanner coupled to the FET switches at the gate contacts. A directional coupler directs a value of forward and reflected power to the comparator which analyzes the VSWR's and detects when they have exceeded a set point. The FET switches are scanned in sequence by the sequence scanner providing forward biasing to the pin diodes switching different values of inductance in and out of the secondary of the transformer. When the VSWR comparator indicates that the VSWR has dropped below the set point, the scanner ceases to scan. If the set point is again exceeded, the switching is re-engaged.

My solid state tuner can be constructed using multiple values of inductance to be switched in and out of the secondary of the transformer. Those multiple values of inductance are switched in and out by multiple pin diodes, each pin diode coupled to an individual FET switch at the drain contact of the FET. The number of inductive values can be manipulated to adequately cover the range of chamber capacitance encountered in a plasma processing system. The set point for the desired VSWR can be programmed into the comparator depending on the needs of the processing operation.

The solid state tuner of the present invention enables a plasma processing system to utilize RF generators of lower power ratings, resulting in less power used and less capital expenditure. Further, the tuner of the present invention permits optimal load match and power transfer with reduced cooling requirements compared to the prior art tuners. Yet further, the fast response time of the tuner of the present invention enables an operation set point to be quickly set resulting in continuous processing. And still further, the solid state components of the tuner of the present invention provide a tuner with a much higher MTBF compared to the electro-mechanical tuners of the prior art. Other important objects of the present invention will be evident from the Detailed Description of the Preferred Embodiment set forth hereinafter.

BRIEF DESCRIPTION OF THE DRAWINGS

The invention may be best understood by those having ordinary skill in the art by reference to the following detailed description when considered in conjunction with the accompanying drawings in which.

DETAILED DESCRIPTION OF THE INVENTION

Figure 1:
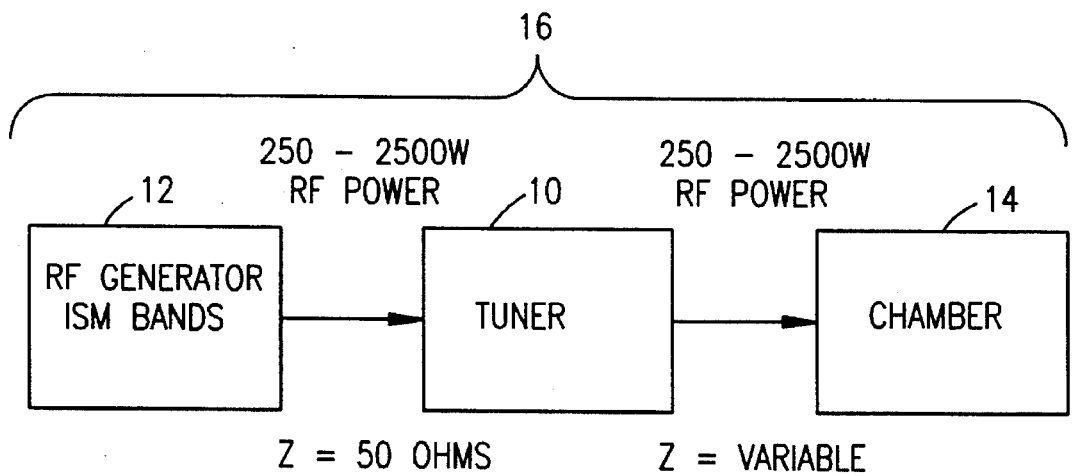
FIG. 1 is a typical arrangement of a plasma processing system utilizing an RF generator, an automatic tuner, and a plasma chamber.

Throughout the following detailed description, the same reference numerals refer to the same elements in all figures.

A solid state tuner 10 is shown in FIG. 1 for insertion between an RF generator 12 and a plasma chamber 14 in a plasma processing system 16. Tuner 10 employs a 1.5 to 50 ohm two step design low loss matching circuit 18, shown in FIG. 2, having a pin diode switched variable inductor circuit 20, shown in FIG. 3, automatically controlled by a tuner control system 22, shown in FIG. 4.

Series resistance and capacitance of the chamber varies as pressure varies within chamber 14 during a processing operation. The design of tuner 10 of the present invention permits VSWR (voltage standing wave ratio) characteristics of chamber 14 to be measured and matched to RF generator 12.

Figure 2:
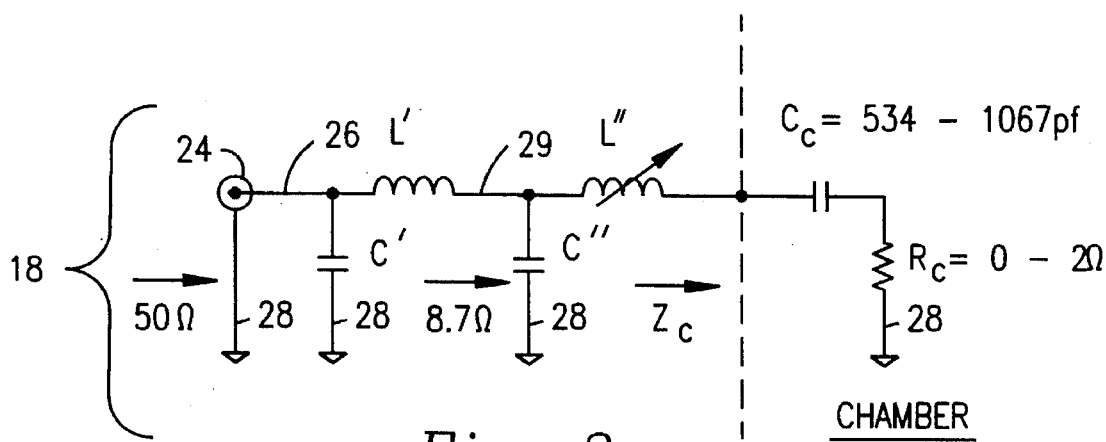
FIG. 2 is a schematic diagram of a matching circuit used in the tuner of the present invention.

Referring to FIG. 2, the low loss two step matching circuit 18 is constructed of a first and second capacitor C' and C''' respectively, a first inductor L', and a second variable inductor L''. L' is coupled to an input 24 by a first lead 26. C' is coupled along first lead 26, intermediate input 24 and L', and references a common ground 28. L'' is coupled in series with L' by lead 29. C'' is coupled along lead 29, intermediate L' and L'', and references ground 28. The matching circuit 18 matches a 50 ohm output impedance from RF generator 12 to the 1–2 ohm varying impedance of chamber 14. The matching circuit 18 provides an intermediate impedance of 8.7 ohms providing two steps of impedance matching, resulting in low power loss through tuner 10. L' has a fixed value and provides the means to step down the 50 ohm RF generator impedance output to a 8.7 ohm intermediate impedance value. Variable inductor L'', constructed as a transformer, provides the impedance transformation from about 8.7 ohms to 1.5 ohms and also resonates out the chamber capacitance $C_c$. The value of L'' is varied by the pin diode switched variable inductor circuit 20, shown in FIG. 3. The two step design for matching circuit 18 is used in the preferred embodiment to provide a better control match due to the extreme difference in the 50 ohm RF generator output and the 1–2 ohm varying chamber impedance. A one step design can be utilize with tuner 10 of the present invention when the varying chamber impedance is higher than 8.7 ohms.

Figure 3:
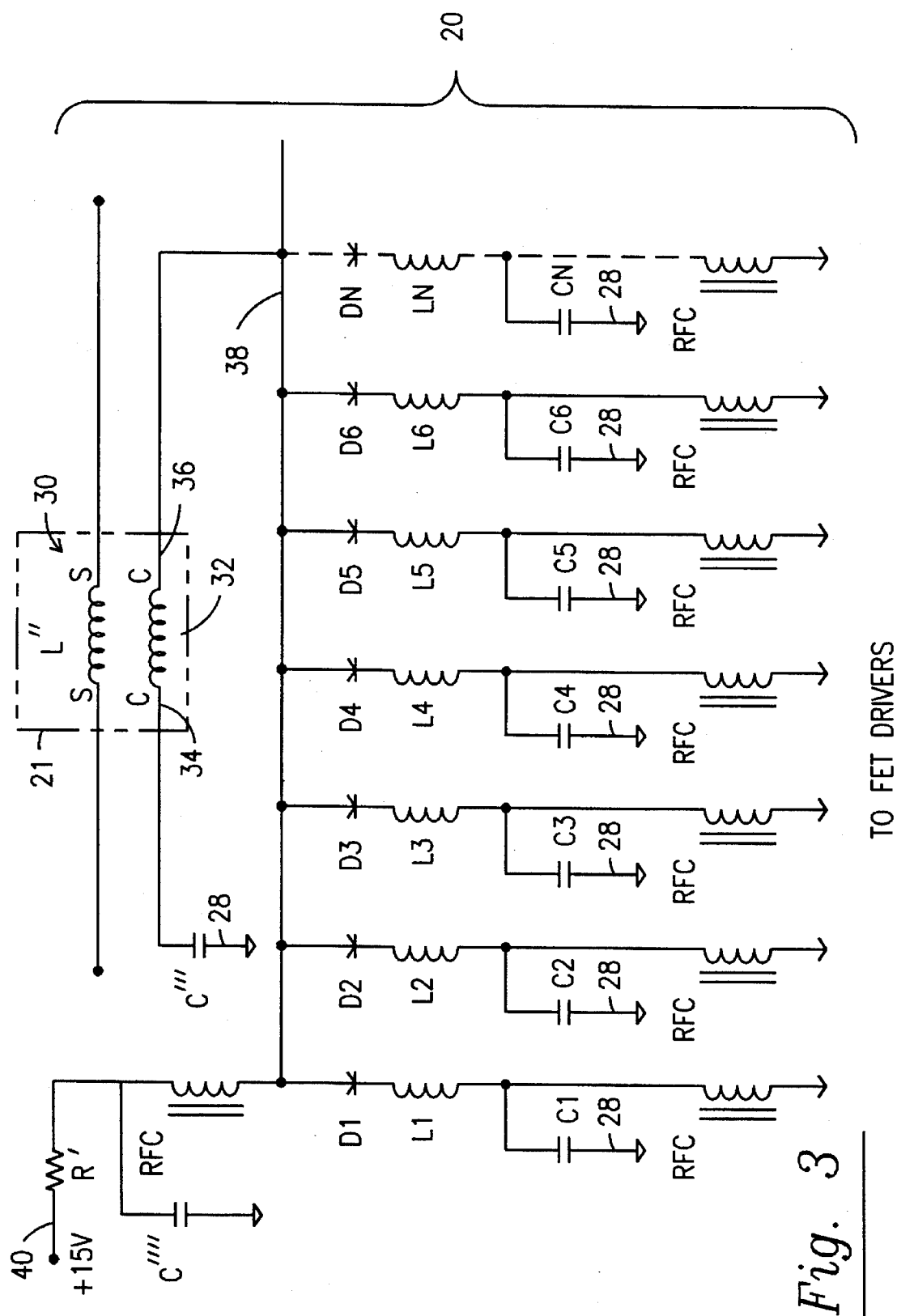
FIG. 3 is a schematic diagram of a pin diode switched inductor variable inductor circuit used in the tuner of the present invention illustrating a preferred configuration.

Referring to FIG. 3, the preferred configuration of pin diode switched variable inductor circuit 20 is shown, wherein L'' is constructed as a transformer 21 using semi-rigid coaxial cable whose shield 30 serves as the primary and whose center conductor 32 serves as the secondary of transformer 21. Shield 30 and center conductor 32 are inductively coupled and have a dielectric medium intermediately spaced therein. The semi-rigid coaxial cable is the preferred manner to construct transformer 21 as the close coupling between shield 30 and center conductor 32 allows consistent coupling of a plurality of pin diode switched inductors L1–LN as values of capacitance in series with the primary of transformer 21. LN represents the highest number of pin diode switched inductors used in tuner 10. The number of pin diode switches is determined before tuner 10 is inserted into plasma processing system 16, of FIG. 1, to adequately cover a range of varying chamber capacitance encountered during a processing operation. The number of pin diode switched inductors typically ranges from two to ten. The customized approach of the present invention allows tuner 10 to be used with a wide range of plasma systems which may encounter either limited amount or a multiplicity of varying chamber capacitance.

Referring to FIG. 3, pin diode switched variable inductor circuit 20 employs variable inductor L''' of matching circuit 18 of FIG. 2. Transformer 21 has a capacitor C''' electrically coupled to ground 28 from a first side 34 of center conductor 32. A second side 36 of center conductor 32 is electrically coupled to a second lead 38. A plurality of inductive networks are electrically coupled in parallel from lead 38 to ground 28 and to a plurality of FET drivers at a drain contact of the FET drivers. Each inductive network has a pin diode D1–DN electrically coupled to lead 38 at an anode of the pin diode in series with an inductor L1–LN and an RF choke RFC, with a capacitor C1–CN electrically coupled to ground 28 at a point intermediate inductor L1–LN and RFC. RFC is electrically coupled in series with the FET driver at the drain contact of the FET. A DC power source 40 is electrically coupled to lead 38 through a resistor R' and an RFC, with a capacitor C'''' electrically coupled to ground 28, intermediate resistor R' and RFC. Pin diode DN represents the largest number of pin diodes used in tuner 10 and is directly proportional to the largest number of pin diode switched inductors LN used in tuner 10. Further, the number of inductive networks and FET drivers are additionally directly proportional to the largest number of pin diode switched inductors LN used in tuner 10. The plurality of inductive networks provide a means to selectively introduce different values of inductance to variable inductor L'' while pin diodes P1–PN and the FET drivers together provide a means to actually switch those different values into the secondary of transformer 21.

Figure 6:
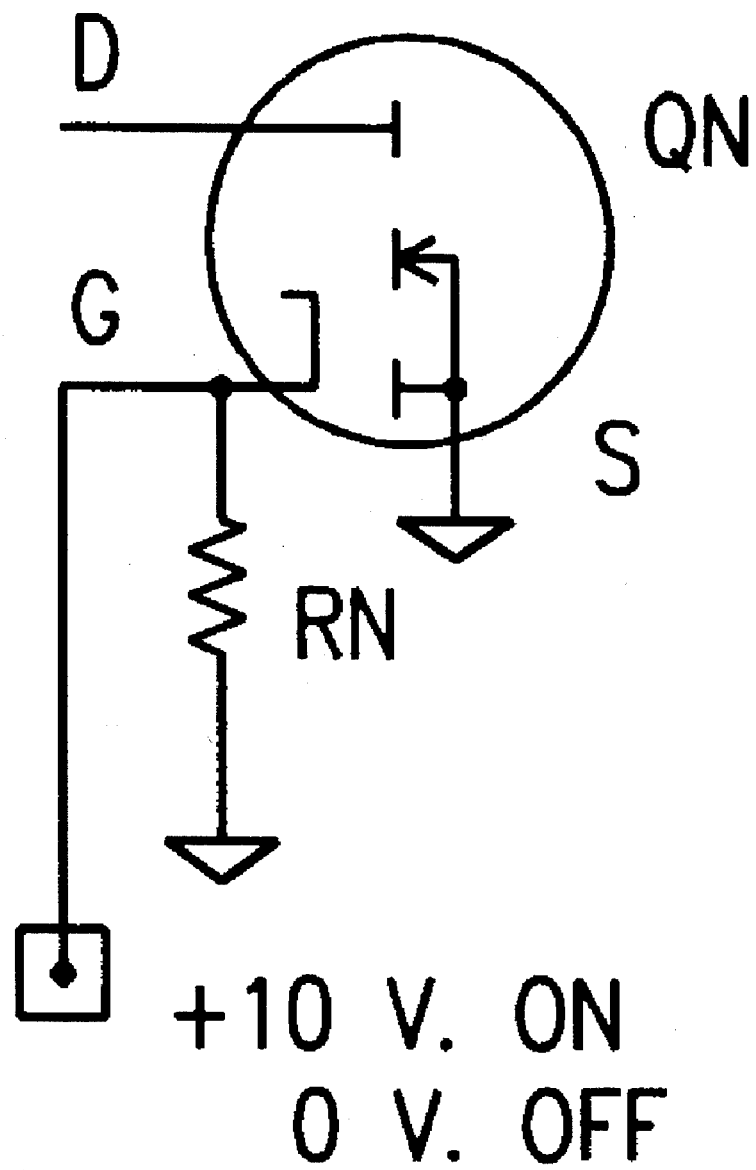
FIG. 6 is a schematic diagram of a FET switch used in the switched variable inductor circuits of FIGS. 3 and 5.

Referring to FIG. 6, a FET driver QN is shown. FET driver QN references ground through a resistor RN at the gate contact of FET driver QN and directly to ground at the source contact. A single switched voltage input supplies power to FET driver QN at the gate contact of FET QN. In the preferred embodiment, the switched voltage input is +10 V and resistor RN has a value of 10K ohms. Each inductive network of circuit 20 is coupled to an individual FET driver, QN representing the largest number of FET drivers used in the present invention, and is directly proportional to the largest number of pin diode switched inductors LN and pin diodes DN used in tuner 10.

The different values of inductance are switched in steps, in and out of the secondary of transformer 21 by pin diodes D1–DN turning on and off. The FET drivers forward bias pin diodes D1–DN. A second higher reverse voltage is not needed to reverse bias pin diodes D1–DN due to the use of the FET drivers. The high off resistance of the FET drivers limits the rectified current flowing through the circuit thereby providing a self reverse biasing means to pin diodes D1–DN. The limiting of rectified current in the circuit is desirous for reducing additional power losses through tuner 10 and is accomplished in tuner 10. The number of pin diode switches PN is selected to adequately cover the range of chamber capacitance encountered during a processing operation as well as to provide small steps to insure a VSWR below a set point.

Pin diode switched variable inductor circuit 20 permits different values of inductance to be switched in and out of the secondary of transformer 21, thereby varying the effective value of variable inductor L" as varying values of chamber capacitance are encountered. In the preferred embodiment, the effective value of L" is only needed to decrease from the value required to resonate chamber 14 before ionization. Therefore, only inductors L1–LN are used in switching the effective value of L".

Figure 5:
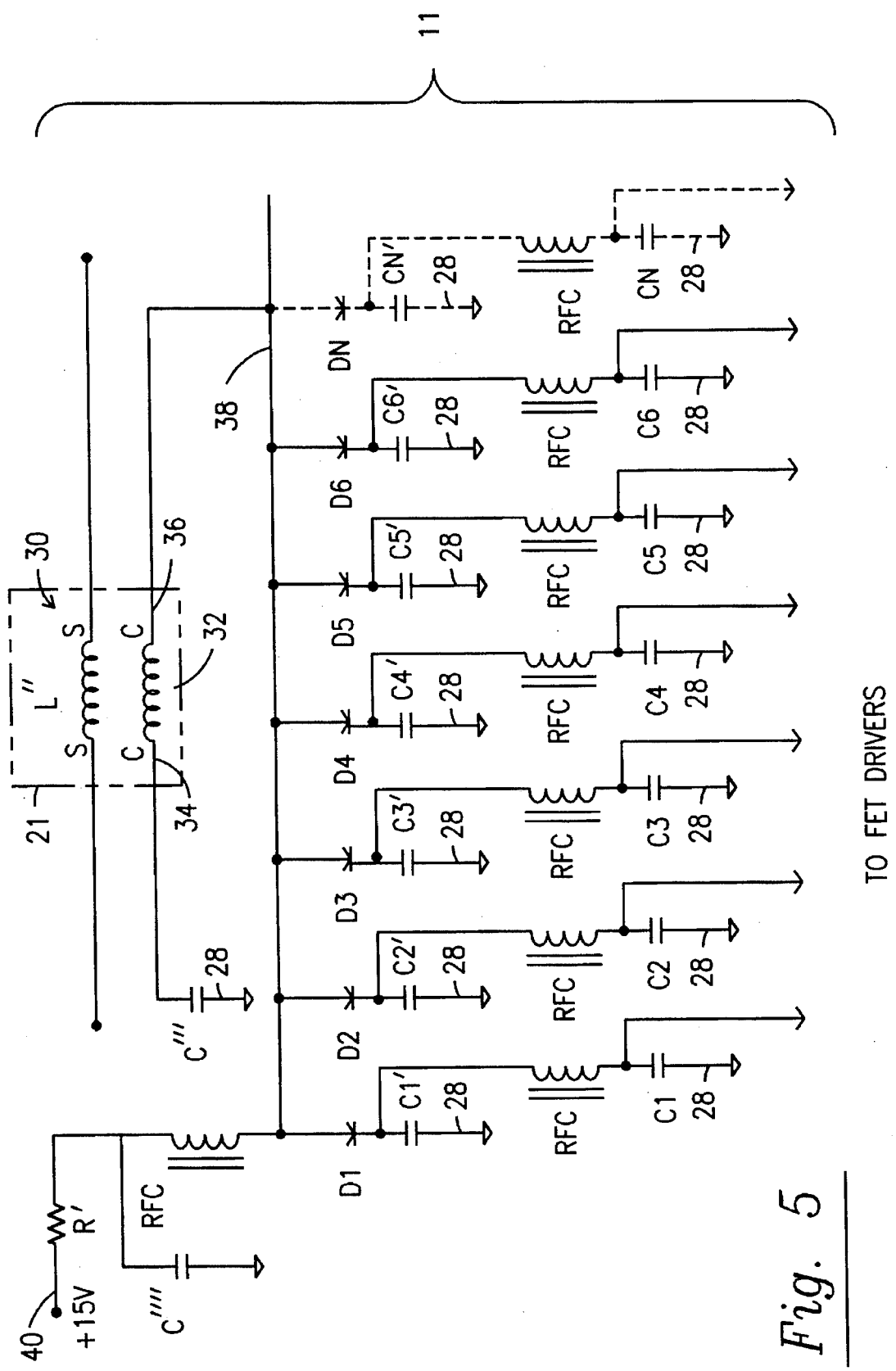
FIG. 5 is a schematic diagram of a pin diode switched capacitor variable inductor circuit used in the tuner of the present invention illustrating an alternate configuration.

In an alternate embodiment, shown in FIG. 5, a switched capacitor variable inductor circuit 11 utilizes a capacitive network wherein the effective value of L" is needed to increase. Circuit 11 employs capacitors C1'–CN' instead of inductors to increase the effective inductive value of L". The highest number of capacitors CN' needed is dependent on the varying chamber capacitance encountered during a processing operation. Typical configurations employ a range of two to ten capacitors for switching the different values of inductance in and out of the secondary of transformer 21.

Referring to FIG. 5, capacitors C1'–CN' are electrically coupled to pin diodes D1–DN at a cathode and reference the common ground 28. The plurality of RF chokes RFC are electrically coupled intermediate a point between pin diodes D1–DN and capacitors C1'–CN' and capacitors C1–CN. Capacitors C1–CN reference the common ground 28. The FET drivers of FIG. 6 used in circuit 11 are electrically coupled to a point intermediate the RF chokes RFC and capacitors C1–CN and reference the common ground 28. In the alternate configuration of capacitive network 11, capacitors C1'–CN' have a value ranging from 100–300 pf.

Yet further, a second alternate tuner (not shown) can be provided wherein the effective value of L" can be decreased and increased by employing both inductors and capacitors, thereby switching in the appropriate value depending on whether the effective value of L" is needed to decrease or increase.

Figure 4:
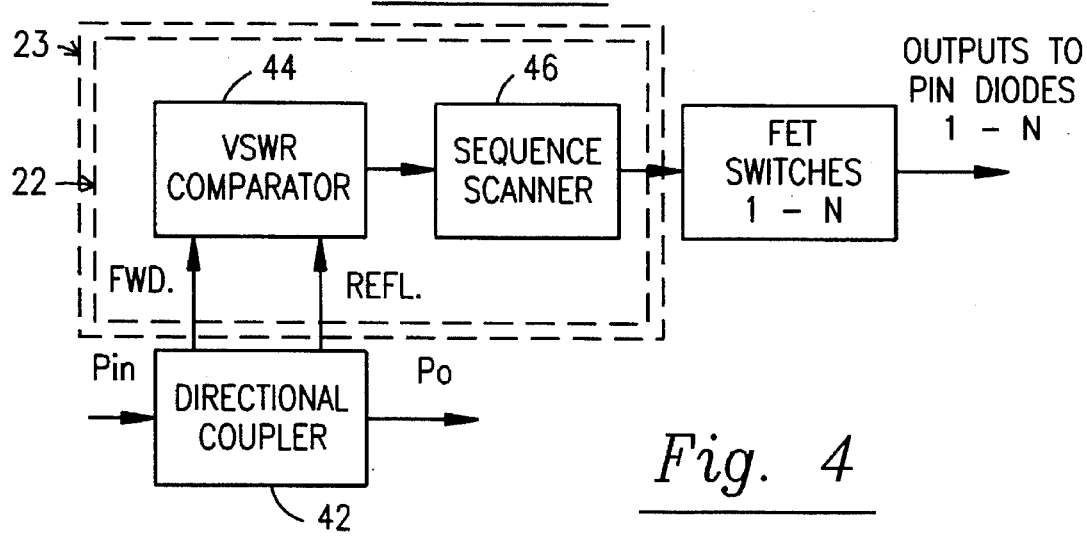
FIG. 4 is a block diagram of a control system used to control the tuner of the present invention.

Automatic selection of the desired inductance in either circuit 20 or 11 is performed by tuner control system 22, as shown in FIG. 4. A directional coupler 42 of RF generator 12 directs a value of forward and reflected power to a VSWR comparator 44. Detector diodes (not shown) coupled to directional coupler 42 measures the voltage standing wave ratio. VSWR comparator 44 has a programmed VSWR set point for ideal processing conditions in processing system 16 of FIG. 1. In the preferred embodiment, the VSWR set point is 1.5:1, although other ratios can be used depending on the application of processing system 16. Comparator 44 continuously detects whether the VSWR has exceeded the set point. Upon exceeding the set point, a sequence scanner 46, directly coupled to the FET drivers at gate contacts and to the comparator 44, scans the switches thereby switching different values of inductance in and out of the secondary of transformer 21 to bring the VSWR back below the programmed set point. Once the VSWR has been brought below the set point, scanner 46 ceases scanning. Since pin diodes are used, the scan time is very fast such that the scanning operation is not detected in the processing operation, thereby minimizing power fluctuations in chamber 14. DC power source 40 is the housekeeping power source for the circuit supplying power to tuner control system 22. In the preferred embodiment comparator 44 and scanner 46 are IC's. An integrated circuit 23 is represented in FIG. 4 for tuner control system 22. If manual switching of circuit 20 or 11 is desired, tuner control system 22 and D.C. power source 40 can be removed from tuner 10. The preferred embodiment of the present invention utilizes the automatic measuring, selection and control of tuner control system 22 as described above as the control means.

The RFC in series with resistor R' prevents any RF signals from passing therethrough. Likewise, the RFC's in the inductive network of FIG. 3 and the capacitive network of FIG. 5 prevent any RF signals from passing therethrough to the FET drivers. Tuner 10 is inserted intermediate RF generator 12 and chamber 14 by coupling input 24 of tuner 10 to an output of RF generator 12, and coupling an output of tuner 10 to an input of chamber 14.

In the preferred embodiment, the value of C' is 512 pf, C' is 3000 pf, and C''', C'''', and C1–CN all have a value of 0.01 uf. Further to the preferred embodiment, the value of L' is 222 nh, variable inductor L" ranges from 130–260 nh. The values of pin diode switched inductors L1–LN range in value of 170–250 nh. The value of resistor R' is 22 ohms with a power rating of 10 watts. The value of all the RFC's are 5 uh. The FET Drivers are 2N6802's. Pin diodes D1–DN are GC4605-173 Loral pin diodes. Components having different values as the ones set forth above can be used to achieve the same results in the same manner. Further, equivalent components can be substituted in tuner 10 for the ones set forth herein to achieve the same results in the same manner.

Having thus described the invention what is claimed and desired to be secured by Letters Patent is:

1. A switched variable inductor network for adjusting a voltage standing wave ratio of a plasma processing system, the switched variable inductor network coupled between an RF generator and a plasma chamber of the plasma processing system, the switched variable inductor network comprising, a variable inductor constructed as a transformer having a primary and secondary winding and referencing a common ground of the network, individual selectable inductance means for varying the effective value of the variable inductor and including at least one selectable portion, the individual selectable inductance means coupled to the secondary winding of the transformer and referencing the common ground, and switching means for switching the at least one selectable portion of the individual selectable inductance means in and out of the secondary winding of the transformer and including at least one pin diode electrically coupled to at least one FET switch and a single voltage source electrically coupled to the FET switch to selectively forward bias the pin diode, the pin diode electrically coupled in series with the selectable portion of the individual selectable inductance means, the switching means referencing the common ground.

2. The switched variable inductor network of claim 1, wherein the transformer is constructed from coaxial cable having a shield serving as the primary winding of the transformer and a center conductor serving as the secondary winding of the transformer.

3. The switched variable inductor network of claim 1, wherein the at least one selectable portion is a plurality of inductive networks electrically coupled in parallel forming the individual selectable inductance means and the at least one pin diode and the at least one FET switch is a plurality of pin diodes and FET switches electrically coupled in series forming the switching means.

4. The switched variable inductor network of claim 3, wherein a first side of each of the plurality of inductive networks is coupled to a cathode of each of the plurality of pin diodes respectively and a second side of each of the plurality of inductive networks is coupled to each of the plurality of FET switches respectively.

5. The switched variable inductor network of claim 1, wherein the at least one selectable portion is a plurality of capacitive networks electrically coupled in parallel forming the individual selectable inductance means and the at least one pin diode and the at least one FET switch is a plurality of pin diodes and FET switches electrically coupled in series forming the switching means.

6. The switched variable inductor network of claim 5, wherein a first side of each of the plurality of capacitive networks is coupled to a cathode of each of the plurality of pin diodes respectively and a second side of each of the plurality of capacitive networks references the common ground, and wherein each of the plurality of FET switches is coupled to a point intermediate each of the first sides of the plurality of capacitive networks and each of the cathodes of the plurality of pin diodes respectively.

7. The variable inductor network of claim 1, further comprising a control means for measuring the voltage standing wave ratio of the plasma processing system and for automatically controlling the at least one FET switch, the control means electrically coupled intermediate the RF generator and the at least one FET switch.

8. The switched variable inductive network of claim 7, wherein the control means comprises,
   a voltage standing wave ratio comparator comparing a ratio of forward power to reflected power of the plasma processing system to a set point programmed in the comparator, and
   a sequence scanner coupled at a first side to the voltage standing wave ratio comparator and at a second side to the at least one FET switch, the sequence scanner controlling the at least one FET switch.

9. The switched variable inductor network of claim 8, wherein the control means is an integrated circuit.

10. The switched variable inductor network of claim 8, wherein a directional coupler of the RF generator directs a value of forward and reflected power of the plasma processing system to the comparator.

11. The switched variable inductor network of claim 7, wherein a DC power source coupled to an anode of the at least one pin diode supplies power to the control means.

12. The switched variable inductor network of claim 1, wherein the voltage standing wave ratio is adjusted in steps.

13. The switched variable inductor network of claim 1, further comprising at least one RF choke coupled between the at least one selectable portion of the individual selectable inductance means and the at least one FET switch of the switching means, the RF choke preventing any RF current from passing therethrough.

14. A solid state tuner for adjusting a voltage standing wave ratio of a plasma processing system, the plasma processing system including an RF generator and a plasma chamber, the tuner comprising,
   an input coupled to an output of the RF generator,
   an output coupled to an input of the plasma chamber,
   a variable inductor constructed as a transformer having a primary and secondary winding and referencing a common ground of the network, the primary winding coupled intermediate the input and output of the tuner,
   individual selectable inductance means for varying the effective value of the variable inductor and including at least one selectable portion, the individual selectable inductance means coupled to the secondary winding of the transformer and referencing the common ground, and
   switching means for switching the at least one selectable portion of the individual selectable inductance means in and out of the secondary winding of the transformer and including at least one pin diode electrically coupled to at least one FET switch and a single voltage source electrically coupled to the FET switch to selectively forward bias the pin diode, the pin diode electrically coupled in series with the selectable portion of the individual selectable inductance means, the switching means referencing the common ground.

15. The solid state tuner of claim 14, further comprising impedance step down means for providing an intermediate impedance to the tuner, the impedance step down means coupled to the variable inductor.

16. The solid state tuner of claim 15, wherein the intermediate impedance is 8.7 ohm.

17. The solid state tuner of claim 14, wherein the at least one selectable portion is a plurality of inductive networks electrically coupled in parallel forming the individual selectable inductance means and the at least one pin diode and the at least one FET switch is a plurality of pin diodes and FET switches electrically coupled in series forming the switching means.

18. The solid state tuner of claim 14, wherein the at least one selectable portion is a plurality of capacitive networks electrically coupled in parallel forming the individual selectable inductance means and the at least one pin diode and the at least one FET switch is a plurality of pin diodes and FET switches electrically coupled in series forming the switching means.

19. The solid state tuner of claim 14 further comprising a control means for measuring the voltage standing wave ratio of the plasma processing system and for automatically controlling the at least one FET switch, the control means electrically coupled intermediate the RF generator and the at least one FET switch.

20. A solid state tuner for adjusting a voltage standing wave ratio of a plasma processing system, the plasma processing system including an RF generator and a plasma chamber, the tuner comprising,
   an input coupled to an output of the RF generator,
   an output coupled to an input of the plasma chamber,
   a variable inductor constructed as a transformer having a primary and secondary winding and referencing a common ground of the network, the primary winding coupled intermediate the input and output of the tuner,
   impedance step down means for providing an intermediate impedance to the tuner, the impedance step down means coupled to the variable inductor,
   individual selectable inductance means for varying the effective value of the variable inductor and including at least one selectable portion, the individual selectable inductance means coupled to the secondary winding of the transformer and referencing the common ground,
   switching means for switching the at least one selectable portion of the individual selectable inductance means in and out of the secondary winding of the transformer and including at least one pin diode electrically coupled to at least one FET switch and a single voltage source electrically coupled to the FET switch to selectively forward bias the pin diode, the pin diode electrically coupled in series with the selectable portion of the individual selectable inductance means, the switching means referencing the common ground, and control means for measuring the voltage standing wave ratio of the plasma processing system and for automatically controlling the at least one FET switch, the control means electrically coupled intermediate the RF generator and the at least one FET switch.

* * * * *